Aug. 16, 1966 J. A. SCARONI, JR 3,267,384

PHASE DISCRIMINATOR OF OPTIMUM LINEARITY BANDWIDTH

Filed March 16, 1964

INVENTOR.
Joseph A. Scaroni, Jr.

BY C. A. Gulbrandsen

ATTY.

United States Patent Office 3,267,384

Patented August 16, 1966

3,267,384

PHASE DISCRIMINATOR OF OPTIMUM LINEARITY BANDWIDTH

Joseph A. Scaroni, Jr., Menlo Park, Calif., assignor, by mesne assignments, to Automatic Electric Laboratories, Inc., Northlake, Ill., a corporation of Delaware Filed Mar. 16, 1964, Ser. No. 352,029

5 Claims. (Cl. 329—137)

This invention relates to detector circuits and more particularly to phase shift discriminators.

The use of a phase shift discriminator circuit for the detection of frequency modulated signals is well known, as evidenced for example in U.S. Patent 2,121,103, issued to S. W. Seeley, June 21, 1938. That patent discloses a circuit utilizing a double tuned transformer tuned to resonance at the center frequency of the operating band, wherein the phase angle between the primary and secondary circuits is 90° at the center frequency, and varies as the input frequency varies from resonance. A reasonable range of operating frequencies may be realized in this mutually coupled arrangement, over which the discriminator output as a function of frequency is a linear relationship.

In some systems, multi-hop microwave receivers, for example, the discriminator circuit must not only have a wide bandwidth to accommodate the information frequency range, but also must maintain strict linearity to prevent intermodulation distortion and noise from being generated. For the discriminators of the type such as previously described, strict linearity with bandwidth widening can be accomplished, however, only at the expense of decreasing the discriminator output level, which of course is a reduction in sensitivity. This decrease in output level may place a weak signal in the non-linear region of the following detector diode stage, and could result in serious distortion.

Another factor leading to the development of the present invention is that phase differential detectors used in prior art discriminators have an inherent departure from linearity which limits the overall discriminator linearity to ±30° from zero phase angle at the center frequency. This is of no concern in narrow band systems, but when the requirement exists for a wide band, extremely linear discriminator beyond this limit, the detector's non-linearity restricts this goal from being realized.

It is therefore an object of the present invention to provide a discriminator circuit which is extremely linear over a wide band of frequencies without reducing discriminator efficiency.

It is a further object of the present invention to provide a discriminator circuit wherein the phase shift toward the ends of the frequency band may be easily adjusted, thereby increasing the linearity range.

It is a still further object of the present invention to provide a discriminator circuit adaptable for use with transistor amplifiers.

Accordingly, one of the features of the present invention is a phase shifting network comprising a bandpass T section and an *m*-derived bandpass section, the combination having a phase characteristic which increases in steepness toward the ends of the band thus improving the effectiveness of the discriminator. The T section is equivalent to the mutually coupled arrangement previously described, however, the input impedance level is more suited for use with transistor driver amplifiers. An *m*-derived bandpass section with attenuation poles, resonant above and below the T section pass band is added to increase the bandwidth of linearity with no decrease in sensitivity. This section also has greater effect on phase than amplitude at the edges of the desired pass band, and provides flexible means for adjusting discriminator linearity.

At the symmetrical phase shift center frequency (*fo*) of the previously described network's pass band, a phase shift of 77° is obtained—instead of the 90° requirement of common phase differential detector circuits. A 13° compensating phase shift means is added which allows the detector circuit to operate symmetrically with respect to the phase shifting network, thus resulting in a more linear discriminator curve. By the use of the aforementioned phase shifting networks and a phase differential detector circuit, good overall discriminator linearity can be realized beyond ±50° phase shifts.

Other objects and features and a fuller understanding of the invention may be had by referring to the following description and claims of a preferred embodiment of the invention, taken in conjunction with the accompanying drawings in which:

Figure 1:
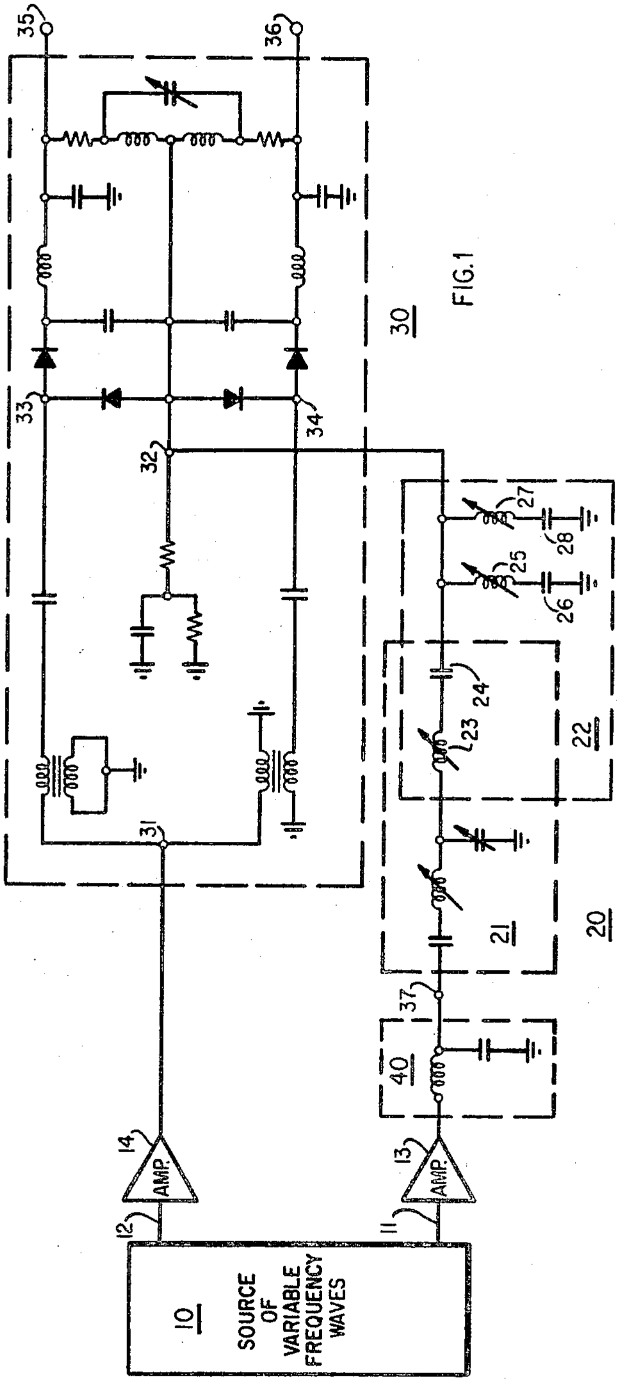
FIGURE 1 is a circuit diagram of a phase discriminator according to the present invention.

In FIG. 1 there is shown a source of frequency modulated waves 10 operating into signal channels 11 and 12 which have interposed in them driver amplifiers 13 and 14, respectively. The phase shift network 20 shifts the phase of the signal from the amplifier 13 as a function of the signal frequency. The phase shift at the center frequency (*fo*) is approximately 77°. Network 20 is composed of bandpass T section 21 and an *m*-derived bandpass section 22, composed of variable inductor 25, capacitor 26, variable inductor 27, capacitor 28, and a portion of variable inductor 23 and capacitor 24. Bandpass section 22 is designed to match the impedance of T section 21, and to allow shunt elements 25, 26 and 27, 28 to resonate, one above and one below the pass band. Inductors 25 and 27 are adjustable to allow a very convenient and flexible means for varying the phase shift vs. frequency characteristic of the network 20 at the edges of the desired pass band.

The output of network 20 is fed into phase differential detector 30. Detector 30 is arranged to provide zero volts output for a 90° difference in input signals, the arrangement of which is known in prior art.

Because the center frequency (*fo*) of the pass band is only shifted approximately 77° by the network 20, instead of the required 90°, a compensating phase shift circuit 40 is interposed in channel 11 to delay the corresponding signal by approximately 13° at the center frequency.

The transformer input arrangement at terminal 31 is used to obtain reference signals from channel 12 which are 180° apart. The signal on channel 11 as modified by networks 40 and 20 is coupled into detector 30 at terminal 32. An output voltage is derived from terminals 35 and 36. This voltage, shown in FIGURE 2, varies in magnitude and polarity as the signal from the source 10 varies in frequency from center frequency, *fo*.

In the operation of the phase discriminator of FIG. 1, assume initially that the frequency output of source 10 is at the center frequency, *fo*. The amplifiers 13 and 14 are designed to have equal phase effect. The signal at terminal 31 leads the signal at 37 by approximately 13° due to the phase delay of compensating phase shift circuit 40.

Phase shifting network 20 adds another approximately 77° to this phase lead, so that the signal at 32 lags that at 31 by 90°. As is evident from FIG. 1, the input transformer arrangement of detector 30 allows the signals of channels 11 and 12 to be coupled together at 33 and 34. Since the signals from both channels are 90° apart at 33 and 34, there will be no voltage developed across discriminator output terminals 35 and 36.

Figure 2:
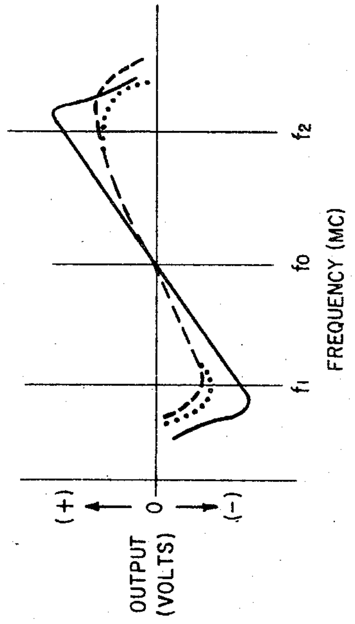
FIGURE 2 is a diagram helpful in explaining the improvement in the present invention.

For frequencies either side of $fo$ the voltage output at 35 and 36 will be as shown in FIG. 2. The dashed curve illustrates the output voltage as a function of frequency for prior art phase discriminators, while the solid curve depicts the same variation for the discriminator constructed according to the present invention. It may be noticed that the linearity has been increased over a wider band due to greater phase slope and better symmetry, with a corresponding increase in discriminator sensitivity.

This improvement is due to the *m*-derived bandpass section whose poles resonate one above and one below the pass band and the additional 13° phase shift obtained from network 40. The use of only T section 21 and circuit 40 as the phase shifting networks results in good discriminator linearity due to better symmetry out to about ±30° phase shift. This is illustrated as the dotted curve in FIG. 2. Linearity beyond ±30° is limited by inherent error in the phase detector 30. The solid curve of FIG. 2 illustrates the increase in linearity bandwidth and sensitivity obtained by adding the *m*-derived bandpass section which extends linearity to ±50° phase shifts.

By way of example only, the following values of a 60–80 mc. discriminator may be used for the most important components shown in FIG. 1:

| | | |
|---|---|---|
| Inductor **23** | microhenries | 0.48 |
| Inductor **25** | do | 0.80 |
| Inductor **27** | do | 0.55 |
| Capacitor **24** | picofarads | 16 |
| Capacitor **26** | do | 13 |
| Capacitor **28** | do | 4.7 |

The compensating phase shift circuit 40 may be composed of a predetermined length of line to delay the signal of channel 11 the additional amount that is required. Again, by way of example only, snice there is a phase delay of about 2.3° per inch at the center frequency of 70 mc., a delay of approximately 13° can be obtained by having circuit 40 in the form of a length of line such that the path length from amplifier 13 to terminal 37 is about 5 inches longer than that from amplifier 14 to terminal 31.

Circuit 40 could also have been designed as a phase lead circuit and interposed in channel 12 to add the required additional phase to that of network 20. It may also be noted that network 20 could as well be placed in channel 12, as long as the phase difference between the signals at terminals 31 and 32 was the required 90°.

It is to be understood that the above-described arrangements are given only by way of illustration of the principles of the present invention, and that various other arrangements can be devised by those skilled in the art in accordance with these principles without departing from the scope of the invention as hereinafter claimed.

What is claimed is:

1. A phase discriminator circuit comprising a source of wave signals frequency modulated over an operating band of frequencies, two signal channels coupled to said source, a phase shifting network in one of said channels for varying the phase of said wave signal in accordance with the signal frequency, and means responsive to the phase difference between the wave signals in said two channels for varying the output voltage as a generally linear function of said phase difference over said frequency band, and means for improving the linearity of said discriminator circuit over said frequency band, said means including a first resonant circuit in said network for modifying the wave signal phase at one end of said band, a second resonant circuit in said network for modifying the wave signal phase at the other end of said band, and means for predetermining the phase shift at the center frequency of said band.

2. A phase discriminator circuit as claimed in claim 1, wherein the last mentioned means includes means for delaying the signal in one of said channels with respect to the other channel so as to compensate the phase shift at the symmetrical phase shift center frequency of said phase shifting network to substantially 90°.

3. A phase discriminator circuit as claimed in claim 1, wherein said two channels include circuit connections of such a difference in length as to bring about said predetermined phase shift.

4. A phase discriminator circuit as claimed in claim 1, in which said two resonant circuits comprise an *m*-derived band pass section including adjustable shunt arms, said shunt arms being resonant at one and the other end of said operating band respectively.

5. A phase discriminator circuit as claimed in claim 1, in which said phase shifting network comprises a band pass T section.

References Cited by the Examiner

UNITED STATES PATENTS

| | | | |
|---|---|---|---|
| 2,426,187 | 8/1947 | Earp | 329—137 |
| 2,585,532 | 2/1952 | Briggs | 329—137 |
| 2,589,236 | 3/1952 | Earp | 329—138 X |

ROY LAKE, *Primary Examiner.*

A. L. BRODY, *Assistant Examiner.*